United States Patent
Cho et al.

(10) Patent No.: US 7,498,600 B2
(45) Date of Patent: Mar. 3, 2009

(54) VARIABLE RESISTANCE RANDOM ACCESS MEMORY DEVICE AND A METHOD OF FABRICATING THE SAME

(75) Inventors: Choong-Rae Cho, Gimhae-si (KR); Eun-Hong Lee, Anyang-si (KR); Stefanovich Genrikh, Suwon-si (KR); El Mostafa Bourim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 11/702,623

(22) Filed: Feb. 6, 2007

(65) Prior Publication Data
US 2007/0295950 A1 Dec. 27, 2007

(30) Foreign Application Priority Data
Jun. 27, 2006 (KR) .................... 10-2006-0058098

(51) Int. Cl.
*H01L 29/02* (2006.01)
*G11C 11/56* (2006.01)

(52) U.S. Cl. .................. 257/2; 257/536; 257/572; 257/E21.591; 438/382; 438/900; 365/148

(58) Field of Classification Search ............. None
See application file for complete search history.

(56) References Cited

U.S. PATENT DOCUMENTS

2006/0180200 A1* 8/2006 Bjorkman et al. ........... 136/265

* cited by examiner

*Primary Examiner*—Evan Pert
*Assistant Examiner*—Scott R Wilson
(74) *Attorney, Agent, or Firm*—Harness, Dickey & Pierce

(57) ABSTRACT

Provided is a variable resistance random access memory device having an n+ interfacial layer and a method of fabricating the same. The variable resistance random access memory device may include a lower electrode, an n+ interfacial layer on the lower electrode, a buffer layer on the n+ interfacial layer, an oxide layer on the buffer layer and having a variable resistance characteristic and an upper electrode on the oxide layer.

18 Claims, 8 Drawing Sheets

VARIABLE RESISTANCE RANDOM ACCESS MEMORY DEVICE AND A METHOD OF FABRICATING THE SAME

PRIORITY STATEMENT

This application claims priority under 35 USC § 119 to Korean Patent Application No. 10-2006-0058098, filed on Jun. 27, 2006, in the Korean Intellectual Property Office (KIPO), the entire contents of which are incorporated herein by reference.

BACKGROUND

1. Field

Example embodiments relate to a non-volatile memory device and a method of fabricating the same. Other example embodiments relate to a variable resistance random access memory device that is operated at a lower operating voltage by including an n+ interfacial layer between a lower electrode formed of a common metal and a buffer layer and a method of fabricating the same.

2. Description of the Related Art

Semiconductor memory devices may have higher integration density, faster operation speeds and lower operating voltage. A conventional memory device may include a plurality of circuitry connected to memory cells. In the case of dynamic random access memory (DRAM), which is representative of a semiconductor memory device, a unit memory cell may include one switch and one capacitor. DRAMs may have higher integration density and faster operating speeds. However, stored data may be erased after power is turned off.

A non-volatile memory device may maintain stored data after power is turned off, and such an example of a non-volatile memory device may be a flash memory. The flash memory may be a non-volatile memory device that differs from the volatile memory device in that the non-volatile memory device may have a lower integration density and slower operating speeds than DRAM.

Research is being conducted on non-volatile memory devices including magnetic random access memory (MRAM), ferroelectric random access memory (FRAM), phase-change random access memory (PRAM) and resistance random access memory (RRAM). Of the above mentioned non-volatile memory devices, RRAM may use variable resistance characteristics according to the voltage of a transition oxide.

FIG. 1A is a diagram illustrating a structure of a RRAM device that uses a variable resistance material having a conventional structure. The RRAM device that uses a transition metal oxide as a variable resistance material may have switching characteristics in order to be used as a memory device.

Referring to FIG. 1A, the RRAM may have a structure in which a lower electrode 12, an oxide layer 14, and an upper electrode 16 may be sequentially formed on a substrate 10. The lower electrode 12 and the upper electrode 16 may be formed of a common conductive metal and the oxide layer 14 may be formed of a transition metal having variable resistance characteristics. The transition metals may include ZnO, $TiO_2$, $Nb_2O_5$, $ZrO_2$ and/or NiO.

FIG. 1B is a graph illustrating operation characteristics of the non-volatile variable resistance memory device illustrated in FIG. 1A. Current was measured by applying a voltage with respect to a specimen in which the lower electrode 12 may be formed of Ru, the oxide layer 14 may be formed of NiO and the upper electrode 16 may be formed of Ru. Referring to FIG. 1B, when about 0.7 V are applied to the specimen at the first switching cycle, the reset current may be about 3 mA. However, after about 50 switching cycles, the reset current may be increased to about 50 mA. As the switching cycles are repeated, the resistance state of the oxide layer 14 may continuously change and an operating voltage and a reset voltage may increase, thereby reducing the reliability of the non-volatile variable resistance memory device. There may be a need to have a structure of a memory device that may have relatively stable operating characteristics.

Because higher integration is structurally difficult in the case of a flash memory device, research on cross-point type memory devices has been conducted. There may be a need to develop a cross-point type memory device having a structure using a variable resistance material. There may be a need of a memory device having a lower electrode using a common metal instead of an expensive noble metal.

SUMMARY

Example embodiments provide a non-volatile memory device, for example, variable resistance random access memory device, that may have a relatively stable reset current even though switching operations may be repeated by including a buffer layer between a lower electrode and a variable resistance oxide layer and an n+ interfacial layer between the buffer layer and the lower electrode, respectively. Example embodiments also provide a higher integration memory device having a lower manufacturing cost by using a common metal as the lower electrode. Other example embodiments provide a method of fabricating the variable resistance random access memory device.

According to example embodiments, a variable resistance random access memory device may include a lower electrode, an n+ interfacial layer on the lower electrode, a buffer layer on the n+ interfacial layer, an oxide layer on the buffer layer and having a variable resistance characteristic and an upper electrode on the oxide layer.

According to example embodiments, a method of fabricating a variable resistance random access memory device may include providing a lower electrode, forming an n+ interfacial layer on the lower electrode, forming a buffer layer on the n+ interfacial layer, forming an oxide layer on the buffer layer having a variable resistance characteristic and forming an upper electrode on the oxide layer.

The oxide layer may be formed of a p type transition metal oxide. The oxide layer may be a Ni oxide layer. The n+ interfacial layer may be formed of at least one of oxygen deficient oxide including ZnOx, TiOx and/or IZOx and/or oxide highly doped with n type impurity including ZnO, TiO and/or IZO. The lower electrode may be formed of one selected from the group consisting of Ni, Co, Cr, W, Cu, Ti and/or an alloy of these metals. The buffer layer may be formed of an n type oxide. The buffer layer may be formed of at least one selected from the group consisting of Ir oxide, Ru oxide, Zn oxide, and IZO. The n+ interfacial layer and the buffer layer may be formed of the same material. The lower electrode may be formed of a non-noble metal.

BRIEF DESCRIPTION OF THE DRAWINGS

Example embodiments will be more clearly understood from the following detailed description taken in conjunction with the accompanying drawings. FIGS. 1A-8 represent non-limiting, example embodiments as described herein.

FIG. 1A is a diagram illustrating a structure of a resistance random access memory (RRAM) device that uses a variable resistance material having a conventional structure;

FIG. 2 is a graph illustrating variations in reset current according to the number of switching cycles of an RRAM device in which a buffer layer is formed on a lower electrode;

FIG. 3 is a graph illustrating current characteristics of an RRAM device that uses tungsten as the lower electrode;

FIG. 4 is a diagram illustrating a variable resistance random access memory device having an n+ interfacial layer according to example embodiments;

FIG. 5 is an energy band diagram showing the Schottky contact between n-IZO (buffer layer) and W (lower electrode);

FIG. 6 is an energy band diagram when an n+ interfacial layer is formed between an n-buffer layer and a lower electrode formed of a common metal;

FIG. 7 is a scatter diagram showing variations in reset current versus the number of switching cycles of a memory device according to example embodiments; and FIG. 8 is a graph illustrating operation principles of a memory device using a variable resistance according to example embodiments.

DETAILED DESCRIPTION OF EXAMPLE EMBODIMENTS

Figure 1A:
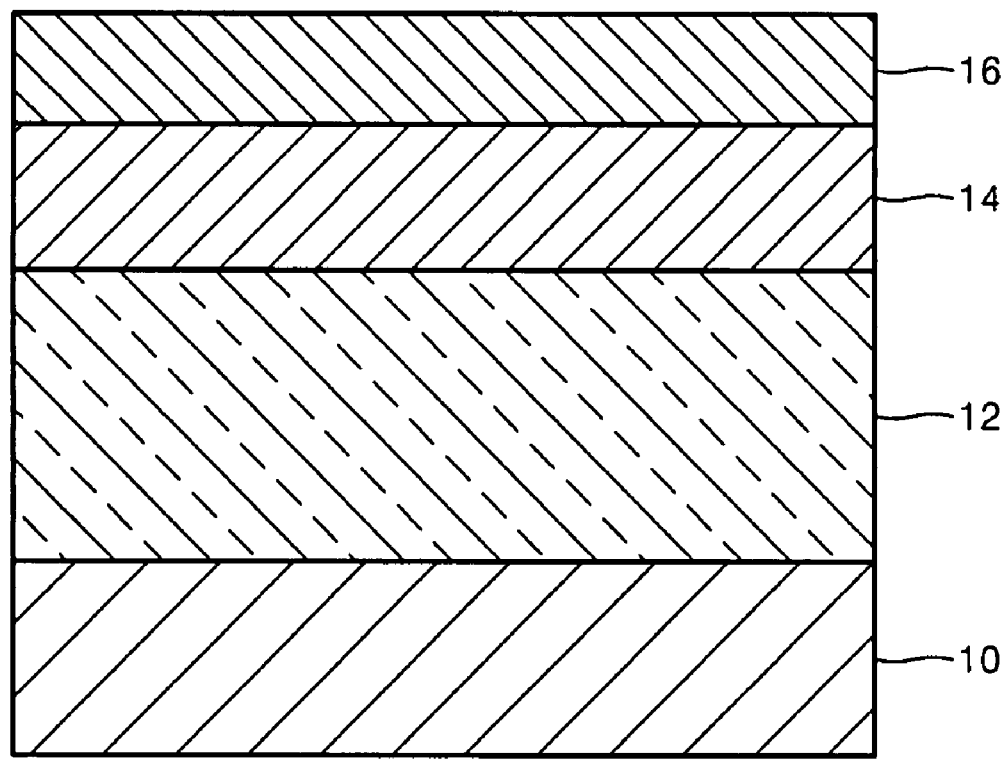

Hereinafter, a variable resistance random access memory device having an n+ interfacial layer according to example embodiments will now be described with reference to accompanying drawings. In the drawings, the thicknesses and widths of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An n+ interfacial layer may be defined as a layer doped with a relatively large number of n-type dopant atoms.

Figure 1B:
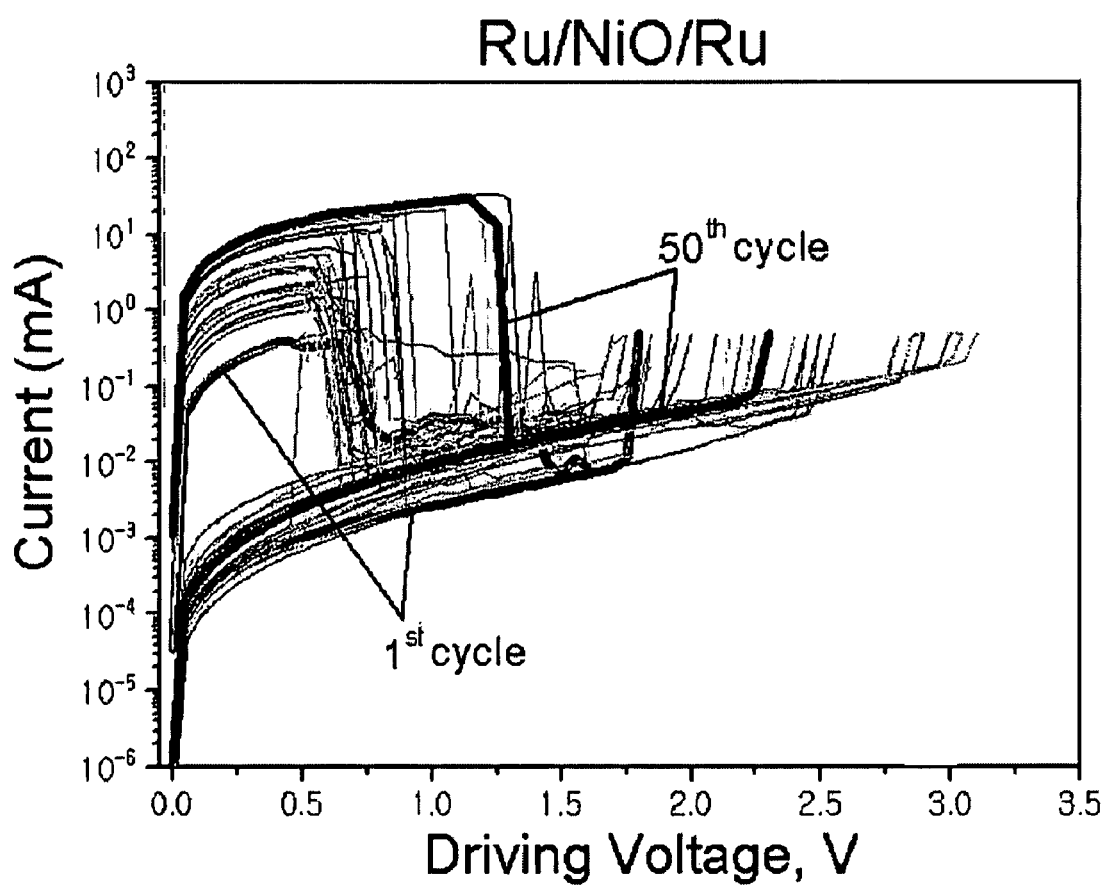
FIG. 1B is a graph illustrating operation characteristics of the non-volatile variable resistance memory device illustrated in FIG. 1A.
Figure 2:
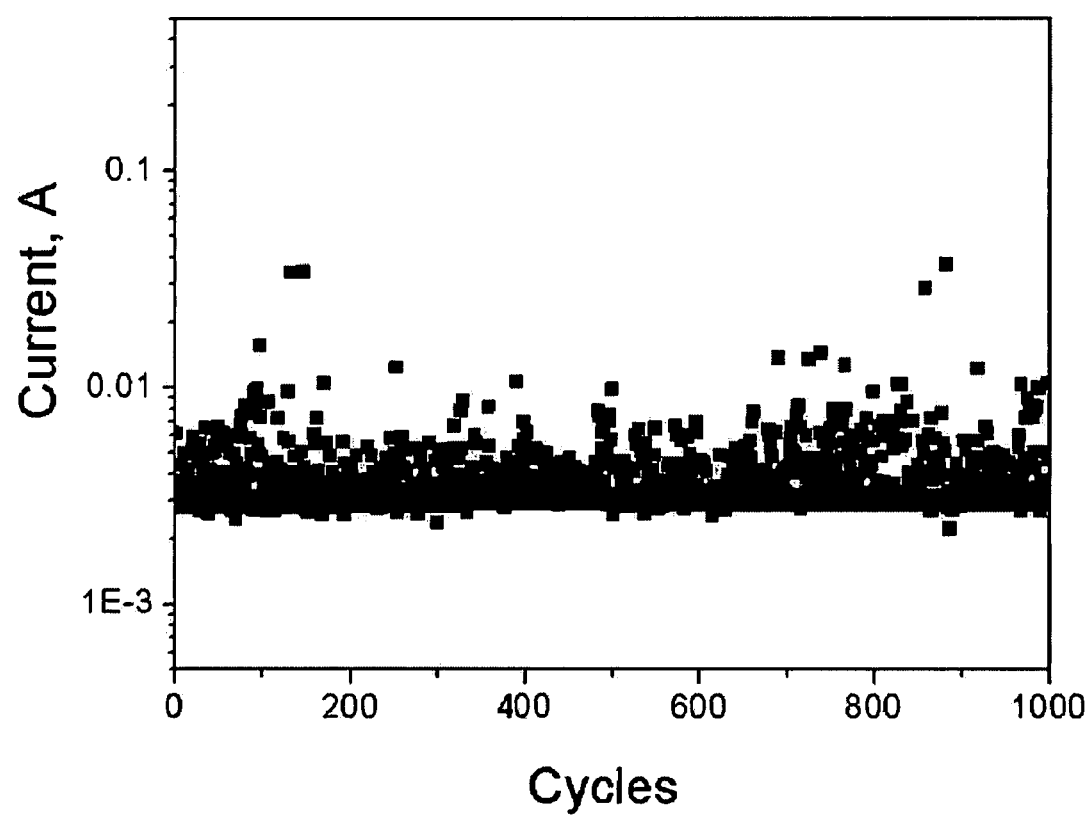

FIG. 2 is a graph illustrating variations in reset current versus the number of switching cycles of a resistance random access memory (RRAM) device in which a buffer layer is formed on a lower electrode. Referring to FIG. 2, the RRAM device may include a lower electrode formed of Ru, a buffer layer formed of ZnO, and a variable resistance oxide layer formed of NiO. The RRAM device may have an average reset current of about 4.5 mA, which is a lower reset current and may have lower deviation of the reset current than the conventional RRAM (refer to FIG. 1B).

Figure 3:
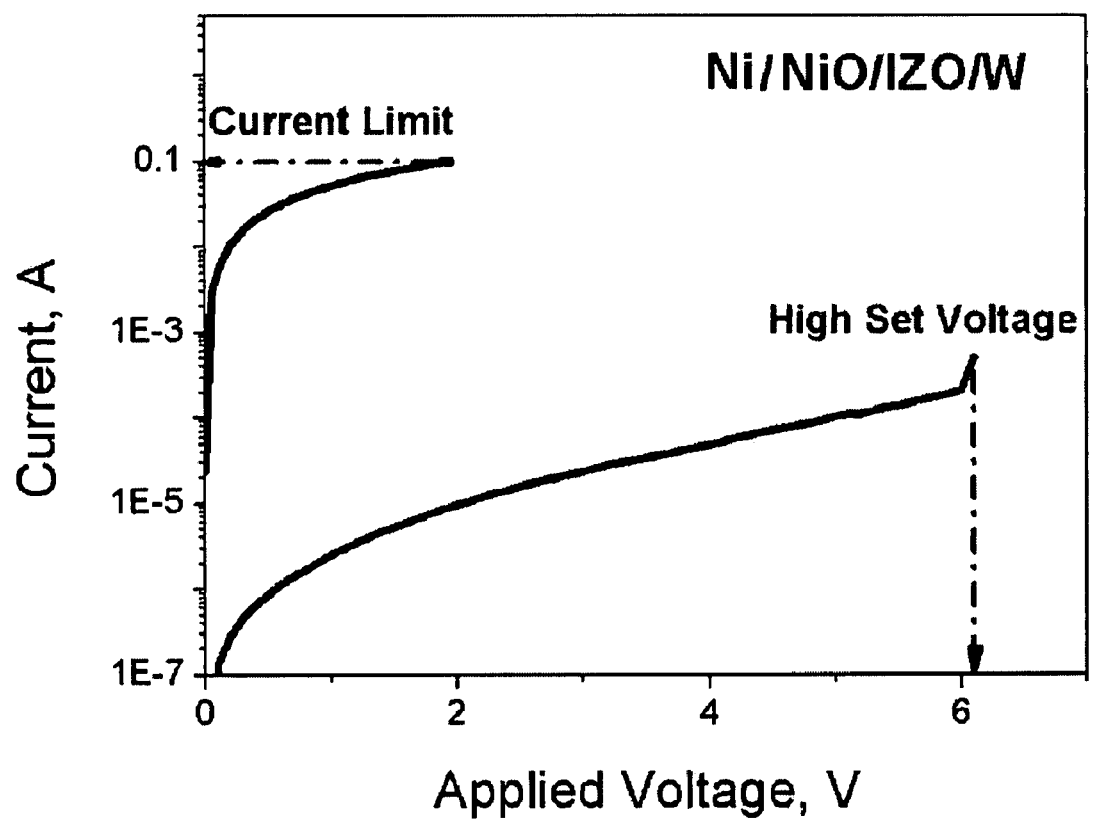

FIG. 3 is a graph illustrating current characteristics of an RRAM device including a lower electrode formed of W which may be a common metal. A buffer layer formed of IZO, a variable resistance oxide layer formed of NiO, and an upper electrode formed of Ni may be sequentially formed on the lower electrode. Referring to FIG. 3, after a relatively high voltage (about 6V) is applied to the RRAM device that uses the lower electrode formed of W, a breakdown of a storage node may occur when the reset current is increased. The RRAM device may not work as a memory device when the lower electrode is simply formed of a common metal.

Figure 4:
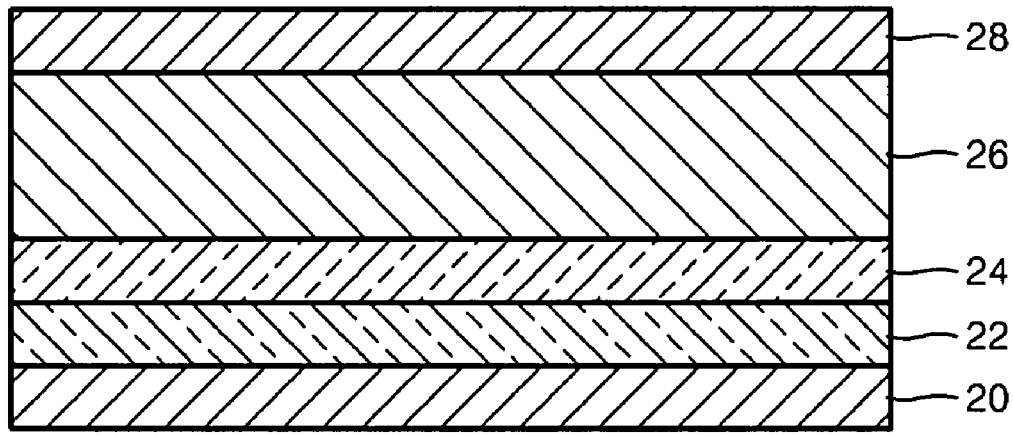

FIG. 4 is a diagram illustrating a variable resistance random access memory device having an n+ interfacial layer according to example embodiments. Referring to FIG. 4, the variable resistance random access memory device having an n+ interfacial layer according to example embodiments may include a lower electrode 20. An n+ interfacial layer 22, an n type buffer layer 24, a variable resistance oxide layer 26, and an upper electrode 28 may be sequentially formed on the lower electrode 20.

The lower electrode 20 may be formed of a common metal (e.g., Ni, Co, Cr, W, Cu, Ti and/or an alloy of these metals). When the common metal is used in the lower electrode 20, manufacturing cost of the memory device may be reduced. The common metal may be used in the lower electrode 20, but example embodiments may not be limited thereto, that is, the lower electrode 20 may be formed of a noble metal as well. The n+ interfacial layer 22 may be formed of an oxygen deficient n type oxide semiconductor (e.g., IZOx, ZnOx and/or TiOx). The n+ interfacial layer 22 may be formed of IZO, ZnO and/or TiO that may be relatively highly doped with a dopant.

The n type buffer layer 24 may be an n type oxide, and may be formed of an oxygen deficient oxide (e.g., IZOx, IrOx, RuOx, ZnOx and/or TiOx) and/or an oxide (e.g., IZO, IrO, RuO, ZnO and/or TiO that may be doped with a dopant). The n+ interfacial layer 22 and the n type buffer layer 24 may be formed of the same material to reduce manufacturing cost and the n+ interfacial layer 22 may be doped with a dopant that may be a few degrees higher in order than the dopant doped to the n type buffer layer 24. The variable resistance oxide layer 26 may be formed of a transition oxide described above (e.g., $ZnO, TiO_2, Nb_2O_5, ZrO_2$ and/or NiO). The upper electrode 28 may be formed of Pt and/or Ti.

Figure 5:
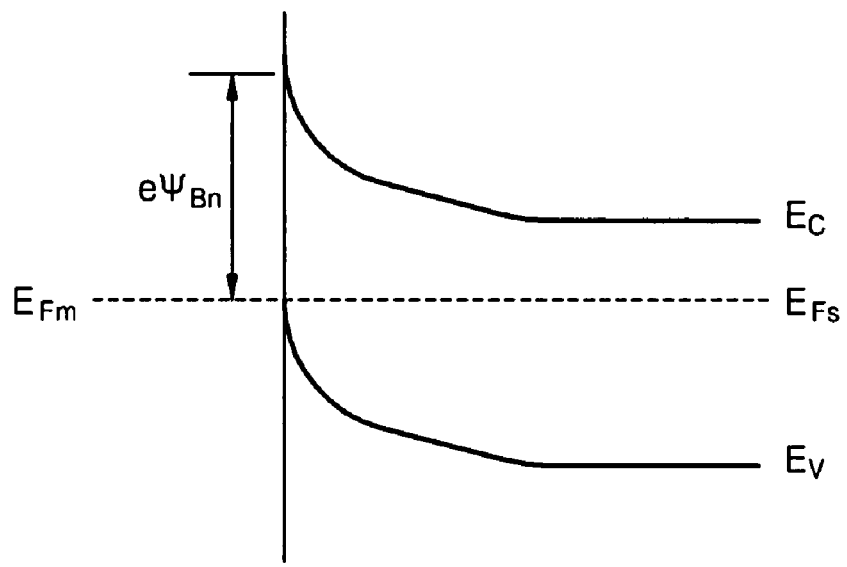

When the lower electrode 20 is formed of a common metal (e.g., tungsten (W)), a work function of the lower electrode 22 may be relatively low. A Schottky contact may be formed at an interface between the lower electrode 20 and the buffer layer 24, for example, an n-IZO layer. When the Schottky contact is formed between the lower electrode 20 and the buffer layer 24, a voltage drop and the degradation of a memory node may occur due to junction resistance. Operation characteristics of the memory device may be impaired or, as depicted in FIG. 3, the breakdown of the memory node may occur. FIG. 5 is an energy band diagram showing the Schottky contact between n-IZO (buffer layer) and W (lower electrode).

Figure 6:
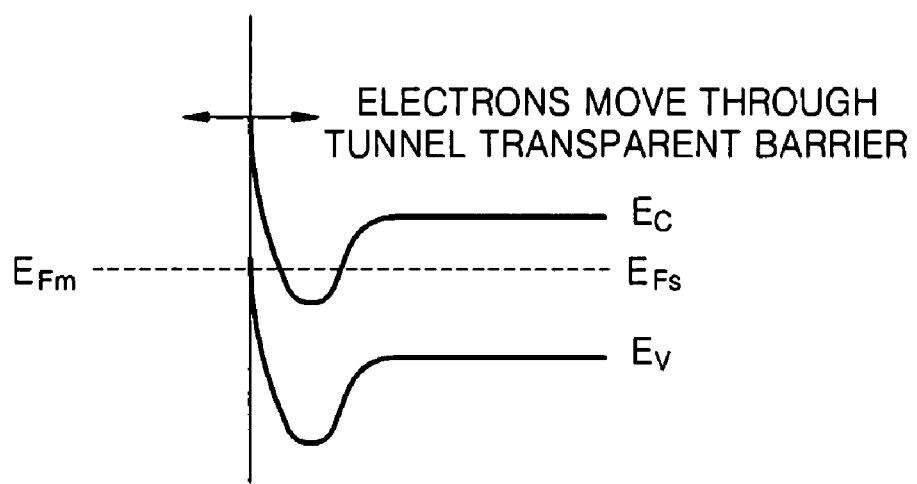

FIG. 6 is an energy band diagram when the n+ interfacial layer 22 is formed between the n-buffer layer 24 and the lower electrode 20 formed of a common metal. A junction layer composed of a composition of n-IZO layer/n+ IZO layer/W layer may be formed.

Referring to FIG. 6, the work function of the lower electrode 20 may be greater than the n+ IZO layer (the n+ interfacial layer 22). Accordingly, an ohmic contact may be formed between the n+ IZO layer and the W layer. Electrons may be more freely transferred between the lower electrode 20 and the n type buffer layer 24 because a barrier between the lower electrode 20 and the n type buffer layer 24 may be formed relatively thinly.

Figure 7:
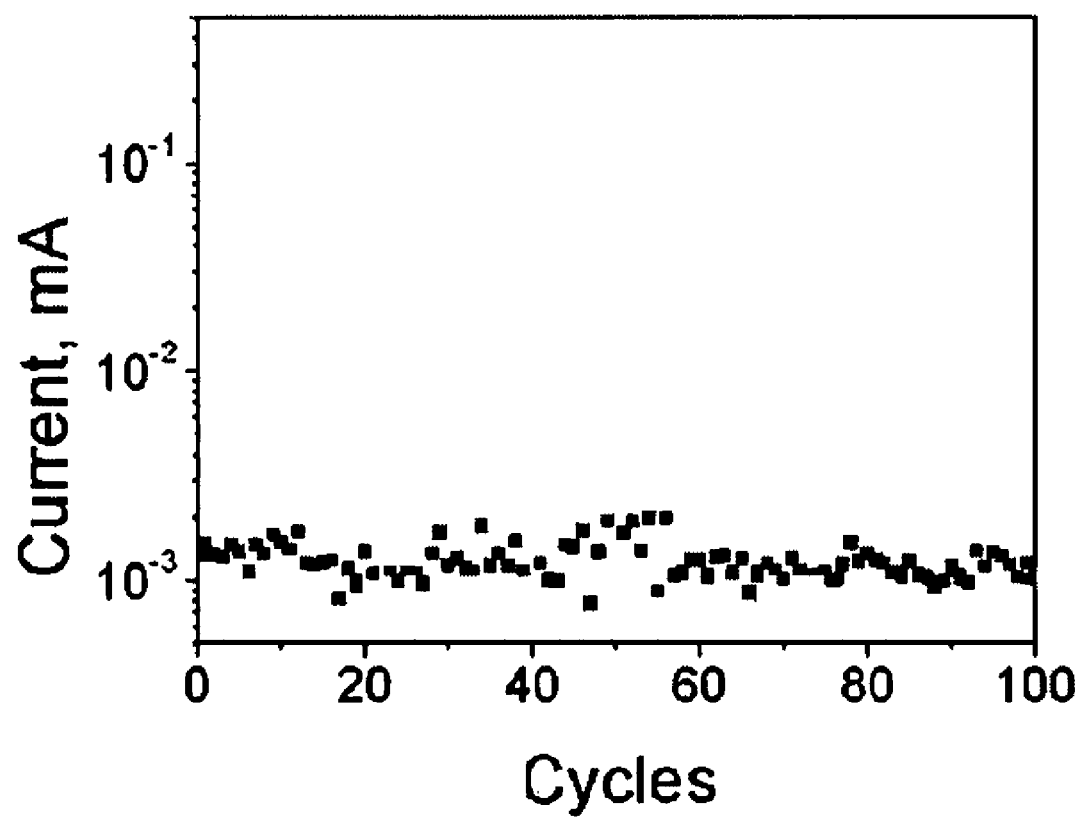

FIG. 7 is a scatter diagram showing variations in reset current versus the number of switching cycles of the memory device according to example embodiments. More specifically, the memory device according to example embodiments may include the n+ IZO interfacial layer having a thickness of about 20 nm, the buffer layer formed of n-IZO having a thickness of about 20 nm, the p-NiO layer having a thickness of about 50 nm, and the upper layer 28 formed of Ni having a thickness of about 20 nm sequentially formed on the lower electrode 20 formed of W having a thickness of about 20 nm.

Referring to FIG. 7, the memory device may have a relatively low variation in reset current, and may have the reset current level of about 1.2 mA. The low reset current may be interpreted that, as depicted in FIG. 6, the formation of the n+ interfacial layer 22 according to example embodiments between the lower electrode 20 and the n type buffer layer 24 reduces the thickness of a barrier between the lower electrode 20 and the n type buffer layer 24, and as a result, electrons readily transfer between the lower electrode 20 and the n type buffer layer 24 through the relatively thin barrier.

The non-volatile memory device that may include a variable resistance material according to example embodiments as described above may be manufactured by a PVD method (e.g., sputtering, an atomic layer deposition (ALD) method and/or a chemical vapor deposition (CVD) method). The thicknesses of the lower electrode 20, the n+ interfacial layer 22, the n type buffer layer 24, the variable resistance oxide layer 26, and the upper electrode 28 may not be limited, and may be formed from about a few nano meters to about a few micrometers. In FIG. 4, the structure of a unit device may be shown, but the non-volatile memory device that may include a variable resistance material according to example embodiments may be used in a cross-point type array.

Figure 8:
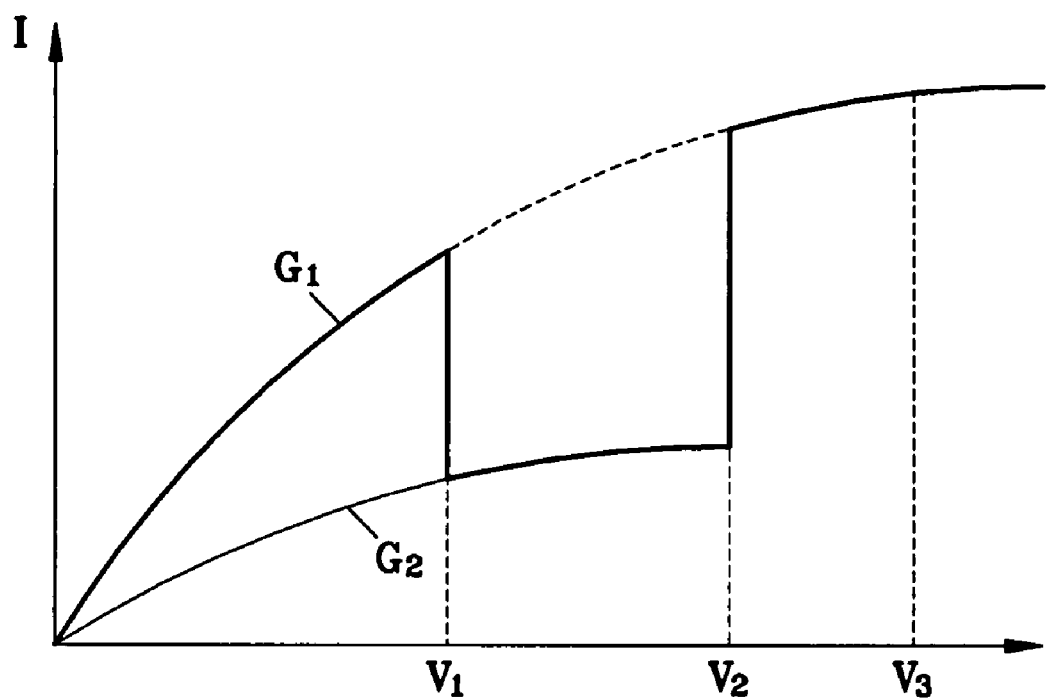

The memory device that uses a variable resistance may have two resistance states, and an operation principle of the memory device will now be described with reference to FIG. 8. FIG. 8 is a graph illustrating operation principles of the memory device that uses a variable resistance according to example embodiments. Referring to FIG. 8, when an applied voltage to the memory device gradually increases from about 0 V, current may increase along a graph $G_1$ proportional to the voltage applied. However, when a voltage greater than V1 is applied, the current may be reduced due to a relatively rapid increase in resistance of the memory device. When a voltage in the range between V1 and V2 is applied, the current may increase along a graph G2. When a voltage greater than V2, for example, a voltage V3 may be applied to the memory device and the current may increase back along the graph G1 due to a relatively rapid decrease in resistance of the memory device. The applied voltage greater than V1 to the memory device may affect the electrical characteristics of the memory device when a voltage smaller than $V_1$ is applied, which will now be described.

After a voltage in the range of $V_1$ to $V_2$ is applied to the memory device, a voltage smaller than $V_1$ may be applied again to the memory device, then, currents of the memory device follow the graph $G_2$. On the other hand, after a voltage greater than $V_2$, for example, $V_3$, is applied to the memory device, a voltage of smaller than $V_1$ may be applied to the memory device, then, currents follow the graph G1 as illustrated in FIG. 8. From this result, electrical characteristics of the memory device may be affected according to the magnitude of the voltage (in the range of V1 to V2 and/or greater than V2) applied to the memory device. A memory device having a variable resistance material, for example, a transition metal oxide, may be applied to a non-volatile memory device. For example, data may be recorded to the memory device by designating a state of the memory device as "0" when a voltage in a range of $V_1$ to $V_2$, as illustrated in FIG. 8, may be applied to the memory device, and designating a state of the memory device as "1" when a voltage greater than $V_2$ is applied. When the data are reproduced, current in an oxide layer may be measured by applying a voltage less than $V_1$ to the memory device, thus, the data stored in the memory device may be determined as being either in the "0" state and/or the "1" state. The designation of state "1" and/or state "0" may be reversed.

A memory device according to example embodiments may have a relatively simple structure and relatively stable switching characteristics, and may be advantageous for relatively high integration because the memory may be used as a cross-point type memory device. The memory device may have relatively stable operation characteristics by including an n+ interfacial layer between a lower electrode and an n buffer layer. The lower electrode may be formed of a relatively inexpensive common metal, thereby reducing manufacturing costs.

While example embodiments have been particularly shown and described with reference to example embodiments thereof, it will be understood by those of ordinary skill in the art that various changes in form and details may be made therein without departing from the spirit and scope of the following claims.

What is claimed is:

1. A variable resistance random access memory device comprising:
    a lower electrode;
    an n+ interfacial layer on the lower electrode;
    a buffer layer on the n+ interfacial layer;
    an oxide layer on the buffer layer and having a variable resistance characteristic; and
    an upper electrode on the oxide layer.

2. The variable resistance random access memory device of claim 1, wherein the oxide layer is formed of a p type transition metal oxide.

3. The variable resistance random access memory device of claim 1, wherein the oxide layer is a Ni oxide layer.

4. The variable resistance random access memory device of claim 1, wherein the n+ interfacial layer is formed of at least one selected from the group consisting of oxygen deficient oxide including ZnOx, TiOx, and IZOx, and oxide highly doped with n type impurity including ZnO, TiO, and IZO.

5. The variable resistance random access memory device of claim 1, wherein the lower electrode is formed of one selected from the group consisting of Ni, Co, Cr, W, Cu, Ti, or an alloy of these metals.

6. The variable resistance random access memory device of claim 1, wherein the buffer layer is formed of an n type oxide.

7. The variable resistance random access memory device of claim 6, wherein the buffer layer is formed of at least one selected from the group consisting of Ir oxide, Ru oxide, Zn oxide, and IZO.

8. The variable resistance random access memory device of claim 1, wherein the n+ interfacial layer and the buffer layer are formed of the same material.

9. The variable resistance random access memory device of claim 1, wherein the lower electrode is formed of a non-noble metal.

10. A method of fabricating a variable resistance random access memory device comprising:
    providing a lower electrode;
    forming an n+ interfacial layer on the lower electrode;
    forming a buffer layer on the n+ interfacial layer;
    forming an oxide layer on the buffer layer having a variable resistance characteristic; and
    forming an upper electrode on the oxide layer.

11. The method of claim 10, wherein forming the oxide layer includes forming a p type transition metal oxide.

12. The method of claim 10, wherein forming the oxide layer includes forming a Ni oxide layer.

13. The method of claim 10, wherein forming the n+ interfacial layer includes forming at least one selected from the group consisting of oxygen deficient oxide including ZnOx, TiOx, and IZOx, and oxide highly doped with n type impurity including ZnO, TiO, and IZO.

14. The method of claim 10, wherein forming the lower electrode includes forming one selected from the group consisting of Ni, Co, Cr, W, Cu, Ti, or an alloy of these metals.

15. The method of claim 10, wherein forming the buffer layer includes forming an n type oxide.

16. The method of claim 15, wherein forming the buffer layer includes forming at least one selected from the group consisting of Ir oxide, Ru oxide, Zn oxide, and IZO.

17. The method of claim 10, wherein the n+ interfacial layer and the buffer layer are formed of the same material.

18. The variable resistance random access memory device of claim 10, wherein the lower electrode is formed of a non-noble metal.

* * * * *